United States Patent
Wang et al.

(10) Patent No.: US 11,450,677 B2
(45) Date of Patent: Sep. 20, 2022

(54) PARTIALLY SILICIDED NONVOLATILE MEMORY DEVICES AND INTEGRATION SCHEMES

(71) Applicant: GLOBALFOUNDRIES Singapore Pte. Ltd., Singapore (SG)

(72) Inventors: Lanxiang Wang, Singapore (SG); Shyue Seng Tan, Singapore (SG); Xinshu Cai, Singapore (SG); Eng Huat Toh, Singapore (SG); Yongshun Sun, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 152 days.

(21) Appl. No.: 17/093,602

(22) Filed: Nov. 9, 2020

(65) Prior Publication Data

US 2022/0149057 A1 May 12, 2022

(51) Int. Cl.
*H01L 27/11521* (2017.01)
*H01L 27/11558* (2017.01)
*H01L 27/11519* (2017.01)

(52) U.S. Cl.
CPC .. *H01L 27/11521* (2013.01); *H01L 27/11519* (2013.01); *H01L 27/11558* (2013.01)

(58) Field of Classification Search
CPC ......... H01L 27/11521; H01L 27/11519; H01L 27/11558
See application file for complete search history.

(56) References Cited

U.S. PATENT DOCUMENTS

| | | | |
|---|---|---|---|
| 7,099,192 B2 | 8/2006 | Wang et al. | |
| 7,759,727 B2 * | 7/2010 | Kalnitsky | G11C 27/005 365/185.26 |
| 8,320,180 B2 | 11/2012 | Kalnitsky et al. | |
| 9,406,764 B2 | 8/2016 | Shum et al. | |
| 9,406,812 B1 * | 8/2016 | Horch | H01L 29/40117 |
| 9,515,152 B2 * | 12/2016 | Guo | H01L 29/7835 |

* cited by examiner

*Primary Examiner* — Allison Bernstein
(74) *Attorney, Agent, or Firm* — David Cain

(57) ABSTRACT

A nonvolatile memory device may be provided. The nonvolatile memory device comprises an active region, an n-well region and an isolation region separating the active region and the n-well region. A floating gate may be provided. The floating gate may be arranged over a portion of the active region and over a first portion of the n-well region. A first doped region in the active region may be laterally displaced from the floating gate on a first side and a second doped region in the active region may be laterally displaced from the floating gate on a second side opposite to the first side. A contact may be arranged over the n-well region, whereby the contact may be laterally displaced from a first corner of the floating gate over the first portion of the n-well region. A silicide exclusion layer may be arranged at least partially over the floating gate.

20 Claims, 9 Drawing Sheets

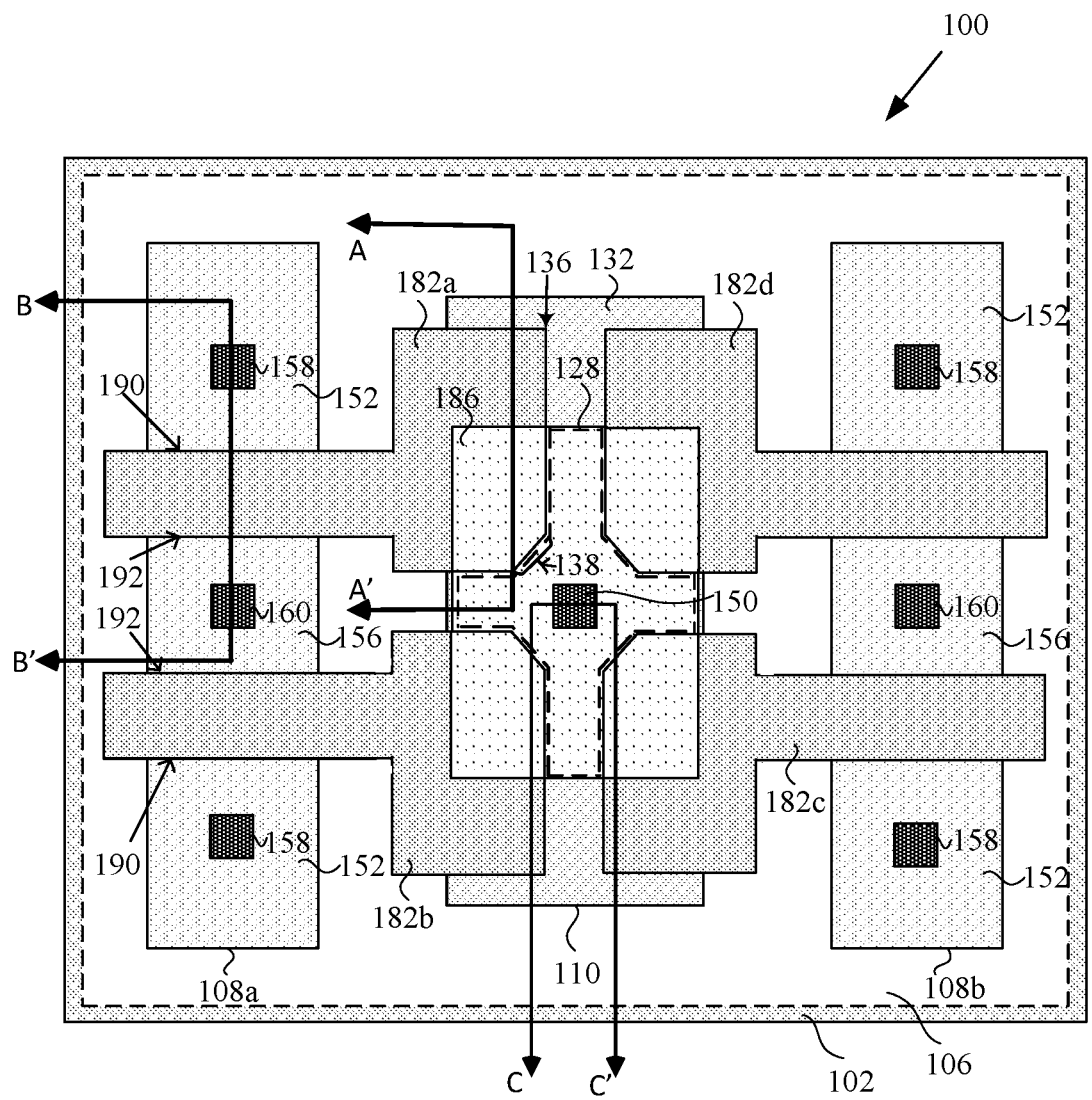
FIG. 1A
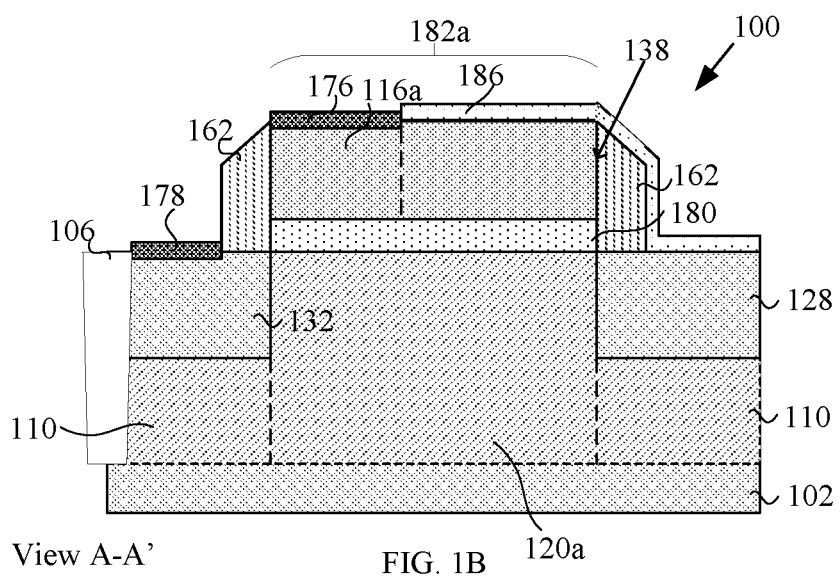
View A-A'    FIG. 1B

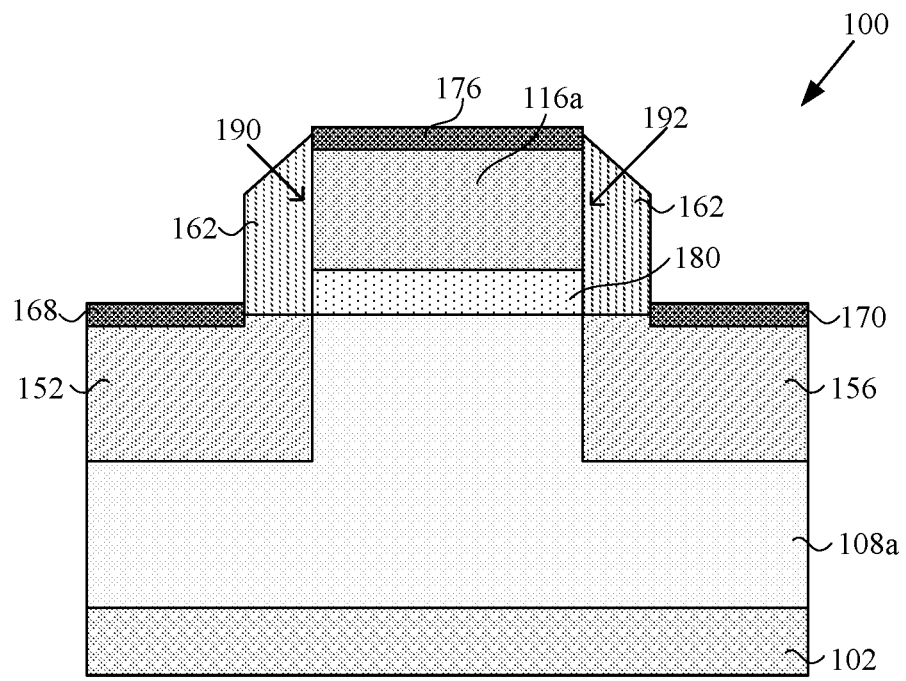
View B-B'  FIG. 1C
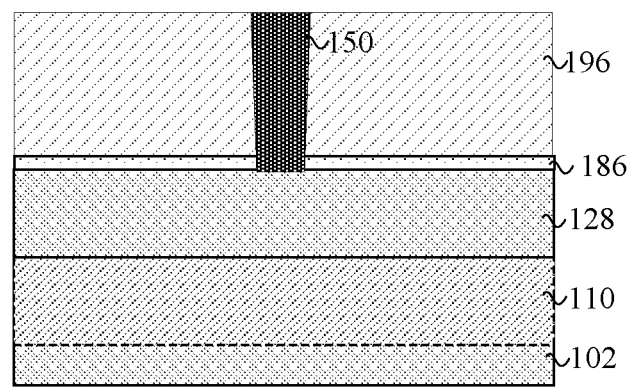
View C-C'  FIG. 1D

View A-A'

View B-B'

View A-A'

View B-B'

View A-A'

View B-B'

View D-D'

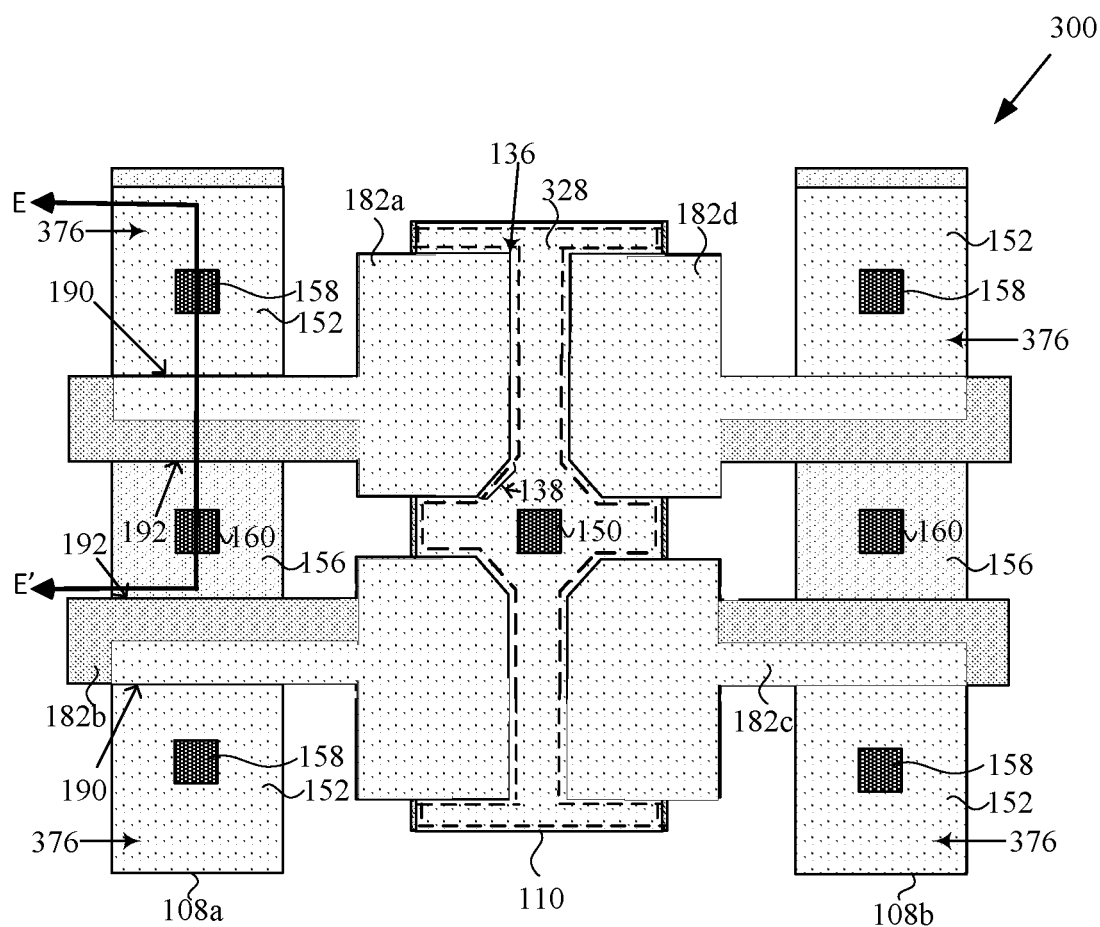
FIG. 6A
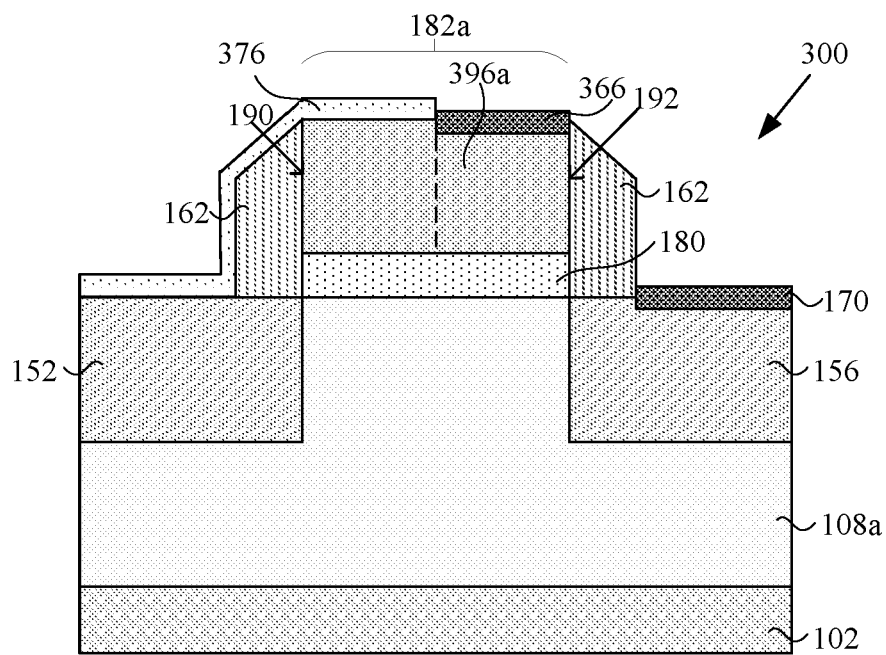
View E-E'    FIG. 6B

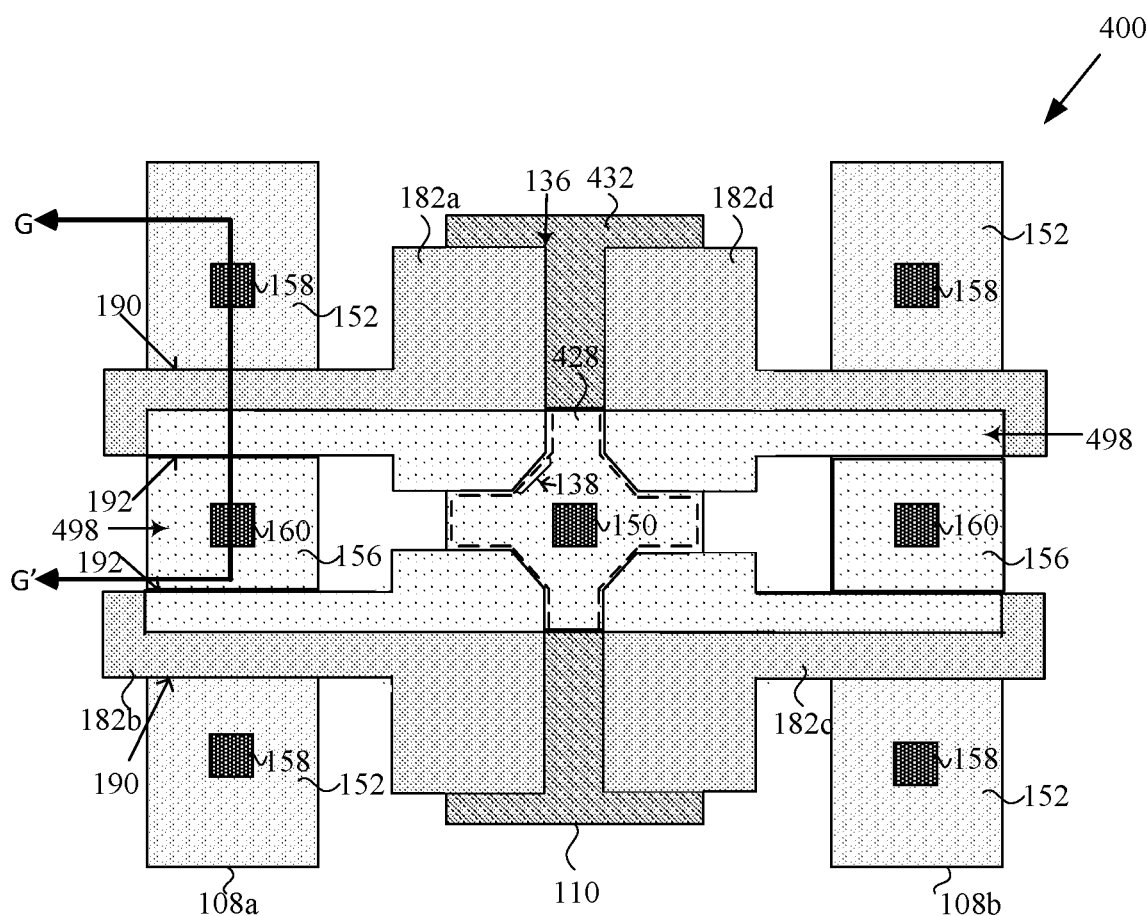
FIG. 7A
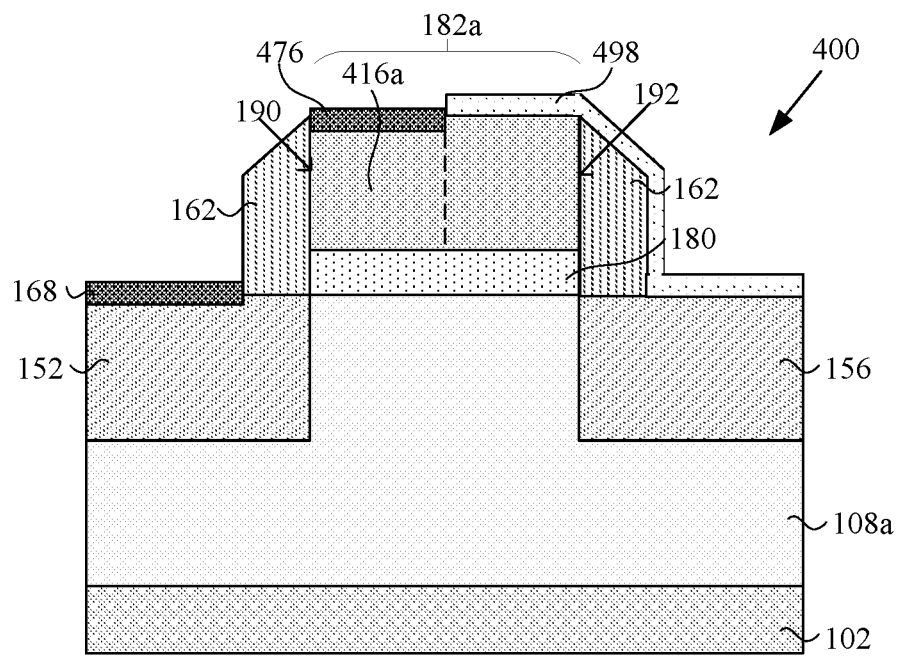
View G-G'   FIG. 7B

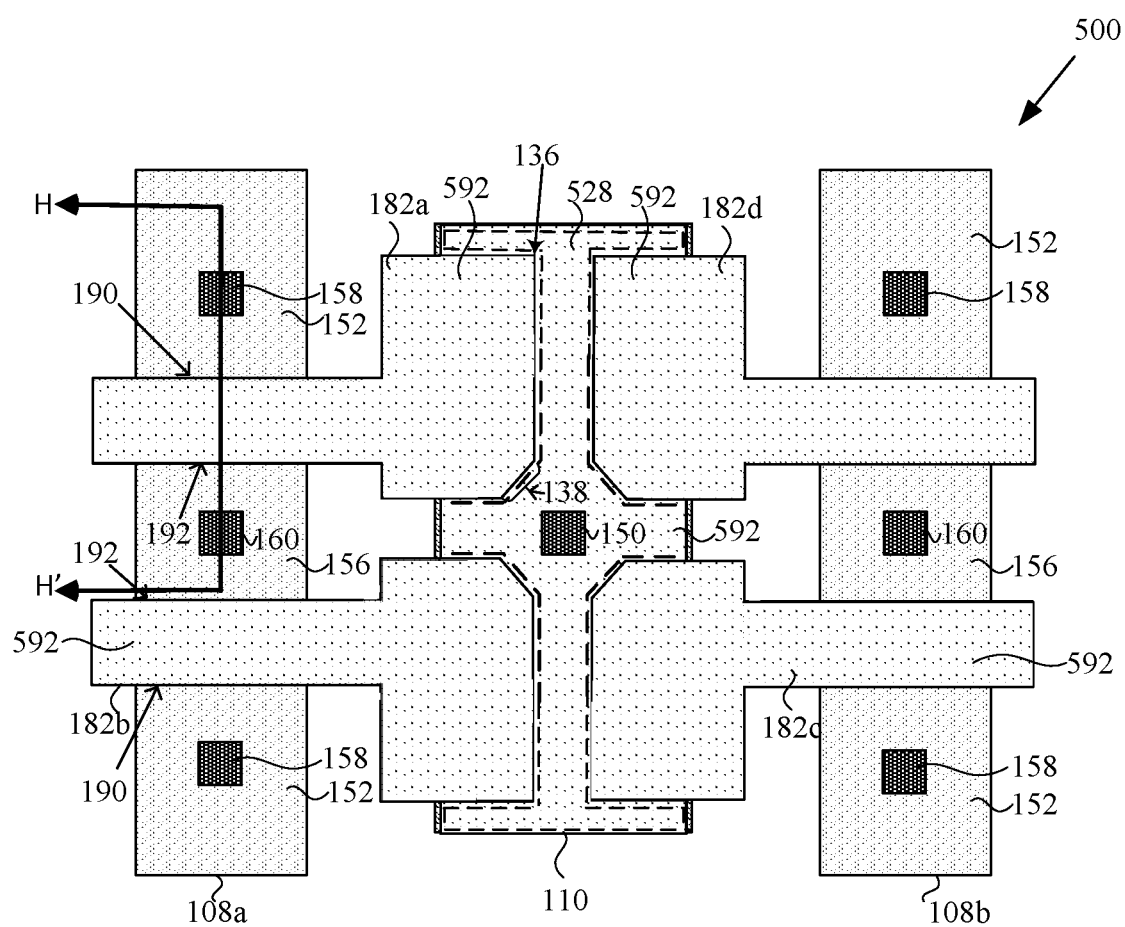
FIG. 8A
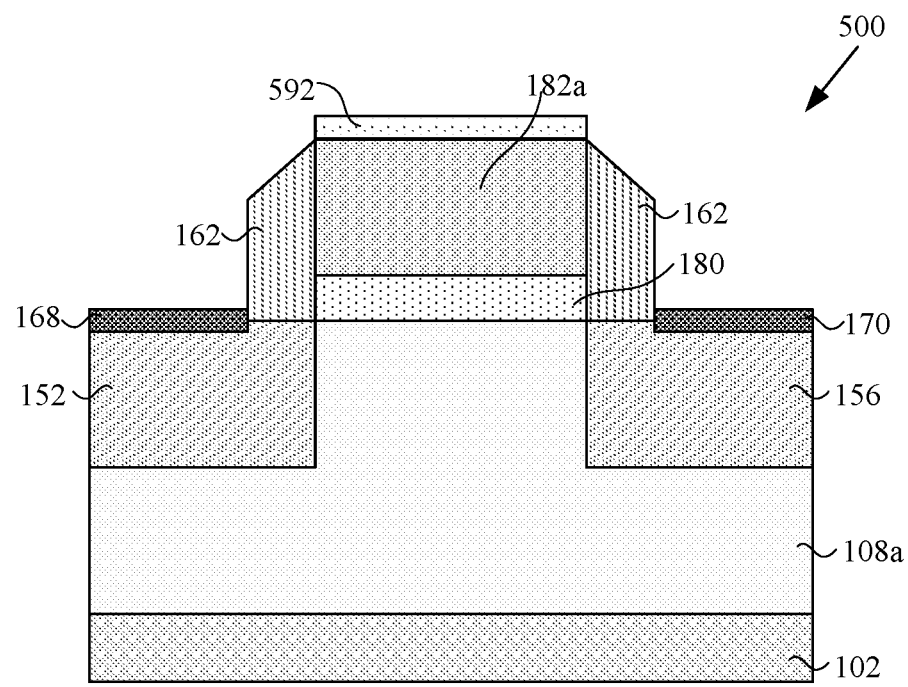
View H-H'   FIG. 8B

PARTIALLY SILICIDED NONVOLATILE MEMORY DEVICES AND INTEGRATION SCHEMES

FIELD OF THE INVENTION

The disclosed embodiments relate generally to semiconductor memory devices, and more particularly, to a partially silicided nonvolatile memory device with improved data retention and good contact resistance.

BACKGROUND

A nonvolatile memory device retains stored data even if power is turned off. A multiple time programmable (MTP) nonvolatile memory includes electrically erasable programmable read only memory (EEPROM) and flash EEPROM. The memory device comprises a memory transistor having a gate electrode separated from an active region by a dielectric layer. A drain region in the active region may be adjacent to a first side of the gate electrode of the memory transistor and a source region in the active region may be adjacent to a second side of the gate electrode opposite to the drain region. The gate electrode may be a floating gate. An n-well capacitor coupled to the gate electrode may be used to bias the floating gate. The n-well capacitor may include a portion of the floating gate over the n-well capacitor as a first electrode and an n-well region as a second electrode. A contact may be provided over the n-well region to couple the n-well capacitor to an input terminal.

A silicide layer may be formed over the floating gate, over the source region, over the drain region and over the n-well region of the n-well capacitor to lower a contact resistance for the nonvolatile memory device. The formation of a silicide layer over a portion of the floating gate proximal to the contact of the n-well capacitor causes leakage paths in the nonvolatile memory device which leads to poor data retention. Nonvolatile memory devices without a silicide layer have improved data retention but a high device contact resistance and poor device performance. Thus, there is a need for an improved nonvolatile memory device to overcome the challenges mentioned above.

SUMMARY

In an aspect of the present disclosure, a nonvolatile memory device is provided. The device comprises an active region, an n-well region and an isolation region separating the active region and the n-well region. A floating gate is provided, the floating gate is arranged over a portion of the active region and a first portion of the n-well region. A first doped region in the active region is laterally displaced from the floating gate on a first side. A second doped region in the active region is laterally displaced from the floating gate on a second side opposite to the first side. A contact is arranged over the n-well region, whereby the contact is laterally displaced from a first corner of the floating gate over the first portion of the n-well region. A silicide exclusion layer is arranged at least partially over the floating gate.

In another aspect of the present disclosure, a nonvolatile memory device is provided. The device comprises a first active region, a second active region, an n-well region between the first active region and the second active region and an isolation region separating the first active region, the second active region and the n-well region. A first floating gate and a second floating gate are arranged over a portion of the first active region and a third floating gate and a fourth floating gate are arranged over a portion of the second active region, whereby each floating gate is arranged over a side portion of the n-well region. A first doped region in each active region is laterally displaced from each floating gate on a first side. A second doped region in each active region is laterally displaced from each floating gate on a second side opposite to the first side. A contact is arranged over the n-well region, whereby the contact is laterally displaced from a first corner of each floating gate over the side portion of the n-well region. A silicide exclusion layer is arranged at least partially over each floating gate, whereby the silicide exclusion layer covers the first corner of each floating gate over the side portion of the n-well region, whereby the first corner is proximal to the contact over the n-well region.

In yet another aspect of the present disclosure, a method of fabricating a memory device is provided. The method comprises providing an active region, an n-well region and an isolation region separating the active region and the n-well region. A floating gate arranged over a portion of the active region and over a first portion of the n-well region may be provided. A first doped region in the active region laterally displaced from the floating gate on a first side may be provided. A second doped region in the active region laterally displaced from the floating gate on a second side opposite to the first side may be provided. A silicide exclusion layer at least partially over the floating gate may be provided. A contact may be provided over the n-well region, whereby the contact is laterally displaced from a first corner of the floating gate over the first portion of the n-well region.

Numerous advantages may be provided in the embodiments described below. The embodiments provide a nonvolatile memory device with improved data retention and good contact resistance while maintaining the device size. A spacer structure may be formed at sidewalls of the floating gate to isolate the floating gate from the n-well region and the active region. The spacer structure may not be perfectly formed at a corner of the floating gate. A silicide layer formed over the floating gate may form a current leakage path across the spacer structure at the corner of the floating gate to the n-well region. Thereby, a silicide exclusion layer over the first corner of the floating gate proximal to an n-well contact prevents formation of the current leakage paths due to the silicidation process. The silicide exclusion layer acts as an additional insulating layer to electrically isolate the floating gate from the n-well region and the n-well contact.

BRIEF DESCRIPTION OF THE DRAWINGS

The disclosed embodiments will be better understood from a reading of the following detailed description, taken in conjunction with the accompanying drawings:

FIG. 1A is a top view of a nonvolatile memory device, according to an embodiment of the disclosure.

FIG. 1B is a cross-section view of an n-well capacitor taken along section line A-A' of the nonvolatile memory device shown in FIG. 1A, according to an embodiment of the disclosure.

FIG. 1C is a cross-section view of a memory transistor taken along section line B-B' of the nonvolatile memory device shown in FIG. 1A, according to an embodiment of the disclosure.

FIG. 1D is a cross-section view of a contact of an n-well capacitor taken along section line C-C' of the nonvolatile memory device shown in FIG. 1A, according to an embodiment of the disclosure.

FIGS. 2A to 4A illustrate a fabrication process flow for an n-well capacitor shown in FIG. 1B, according to some embodiments of the disclosure.

FIGS. 2B to 4B illustrate a fabrication process flow for a memory transistor shown in FIG. 1C, according to some embodiments of the disclosure.

FIG. 6A is a top view of a nonvolatile memory device, according to another embodiment of the disclosure.

FIG. 6B is a cross-section view of memory transistor taken along section line E-E' of the nonvolatile memory device shown in FIG. 6A, according to another embodiment of the disclosure.

FIG. 7A is a top view of a nonvolatile memory device, according to another embodiment of the disclosure.

FIG. 7B is a cross-section view of memory transistor taken along section line G-G' of the nonvolatile memory device shown in FIG. 7A, according to another embodiment of the disclosure.

FIG. 8A is a top view of a nonvolatile memory device, according to another embodiment of the disclosure.

FIG. 8B is a cross-section view of memory transistor taken along section line H-H' of the nonvolatile memory device shown in FIG. 8A, according to another embodiment of the disclosure.

Figure 2A:
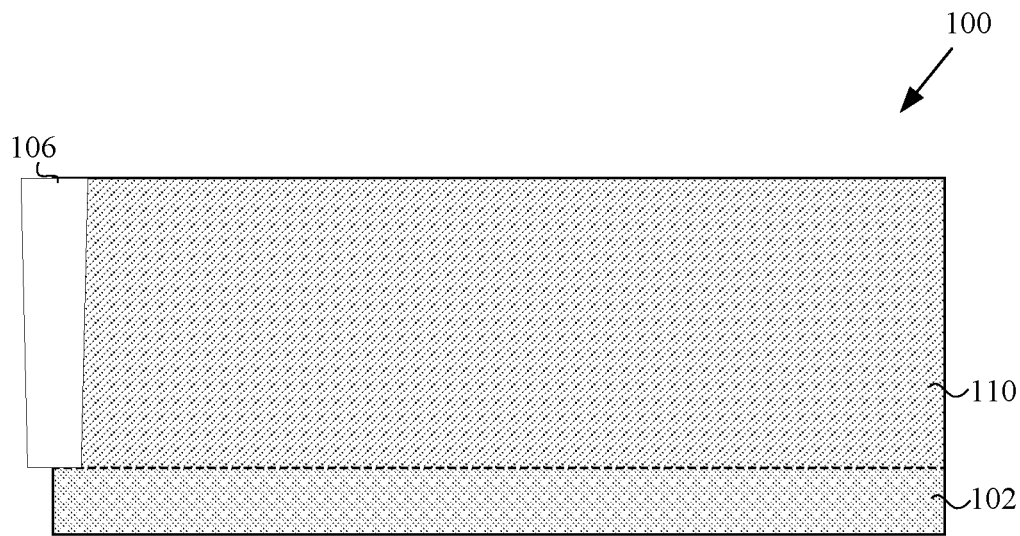

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a top view of a nonvolatile memory device 100, according to an embodiment of the disclosure. Referring to FIG. 1A, the nonvolatile memory device 100 includes a first active region 108a, a second active region 108b, an n-well region 110 between the first active region 108a and the second active region 108b and an isolation region 106 separating the first active region 108a, the second active region 108b and the n-well region 110. The isolation region 106 may be formed in a substrate 102. A first floating gate 182a and a second floating gate 182b may be arranged over a portion of the first active region 108a. A third floating gate 182c and a fourth floating gate 182d may be arranged over a portion of the second active region 108b. Each floating gate 182a, 182b, 182c and 182d may be arranged over a side portion of the n-well region 110. A first doped region 152 in each active region 108a and 108b may be laterally displaced from each floating gate 182a, 182b, 182c and 182d, respectively, on a first side 190. A second doped region 156 in each active region 108a and 108b may be laterally displaced from each floating gate 182a, 182b, 182c and 182d, respectively, on a second side 192 opposite to the first doped region 152 and the first side 190. Although not shown for simplicity, an interlayer dielectric (ILD) layer may be formed over a top surface of each active region 108a and 108b, the n-well region 110, each floating gate 182a, 182b, 182c and 182d and over the isolation structure 106. A contact 158 may be arranged over the first doped region 152 for connection to an external terminal. A contact 160 may be arranged over the second doped region 156 for connection to an external terminal. A contact 150 may be arranged over the n-well region 110, whereby the contact 150 may be laterally and diagonally displaced from a first corner 138 of each floating gate 182a, 182b, 182c and 182d over a side portion of the n-well region 110. The contacts 150, 158 and 156 may be arranged in the interlayer dielectric layer. A silicide exclusion layer 186 may be arranged at least partially over each floating gate 182a, 182b, 182c and 182d. In one embodiment, the silicide exclusion layer 186 may cover the first corner 138 of each floating gate 182a, 182b, 182c and 182d over the side portion of the n-well region 110. The first corner 138 of each floating gate 182a, 182b, 182c and 182d may be proximal to the contact 150 over the n-well region 110. The silicide exclusion layer 186 may extend over a center portion 128 of the n-well region 110 adjacent to the side portion of the n-well region under each floating gate 182a, 182b, 182c and 182d. The center portion 128 of the n-well region is illustrated as a dashed outline. In one embodiment, the silicide exclusion layer 186 may surround the contact 150. In another embodiment, the silicide exclusion layer 186 may extend below the contact 150. In one embodiment, the first corner 138 of each floating gate 182a, 182b, 182c and 182d may be faceted. In another embodiment, the first corner 138 may be rounded. The term "silicide exclusion layer" may refer to a layer of dielectric or insulating material arranged over a semiconductor layer to prevent the formation of a metal silicide on the semiconductor layer.

Each floating gate 182a, 182b, 182c and 182d over each active region 108a and 108b, respectively, provides a gate of a memory transistor. The first doped region 152 may be a source of the memory transistor and the second doped region 156 may be a drain of the memory transistor. Each floating gate 182a, 182b, 182c and 182d and the n-well region 110 provides an n-well capacitor. The contact 150 provides a contact for the n-well capacitor for connection to an external terminal. The term "floating gate" may refer to a gate electrode that is electrically isolated from an input terminal but may be capacitively coupled to the input terminal. There may not be direct current flowing from the input terminal to the floating gate during a reading operation.

The arrangement of the silicide exclusion layer 186 as described above provides an additional insulating layer between each floating gate 182a, 182b, 182c and 182d, the center portion 128 of the n-well region 110 and the contact 150. Additionally, the arrangement of the silicide exclusion layer 186 according to an aspect of the invention eliminates or at least reduces the likelihood of leakage paths forming between the floating gate 182a, 182b, 182c and 182d, the n-well region 110 and the contact 150, particularly in cases where a silicide layer would otherwise be formed at the first corner 138 of each floating gate 182a, 182b, 182c and 182d. The silicide exclusion layer 186 protects a portion of the floating gate 182a, 182b, 182c or 182d underneath the layer 186 from subsequent chemical cleans thereby preventing silicide encroachment into the floating gate 182a, 182b, 182c or 182d through the surrounding insulating layer, for example spacer structures. This leads to improved data retention of the nonvolatile memory device 100. According to another aspect of the invention, a silicide layer that is arranged over the doped regions in the active regions, portions of the n-well region and portions of each floating gate which are uncovered by the silicide exclusion layer 186, provides good contact resistance for the nonvolatile memory device 100.

FIG. 1B is a cross-section view of an n-well capacitor taken along section line A-A' of the nonvolatile memory device 100 shown in FIG. 1A, according to an embodiment of the disclosure. Referring to FIG. 1B, a silicide exclusion layer 186 may be arranged at least partially over the first floating gate 182a, over a center portion 128 of the n-well region 110 adjacent to a side portion 120a of the n-well region 110 under the first floating gate 182a and over a spacer structure 162 adjacent to a sidewall of the first floating gate 182a. The silicide exclusion layer 186 may comprise silicon dioxide, silicon nitride, hafnium oxide ($HfO_2$), or any other suitable dielectric materials.

A silicide layer 176 may be arranged over a portion 116a of the first floating gate 182a adjacent to the silicide exclusion layer 186. A silicide layer 178 may be arranged over an edge portion 132 of the n-well region 110 adjacent to a portion 116a of the first floating gate 182a. A spacer structure 162 may separate the silicide layers 176 and 178. In one embodiment, the center portion 128 and the edge portion 132 of the n-well region 110 may be n+ doped regions. An isolation structure 106 may be arranged adjacent to the edge portion 132 of the n-well region 110. A gate dielectric layer 180 may be arranged between the first floating gate 182a and the n-well region 110.

FIG. 1C is a cross-section view of a memory transistor taken along section line B-B' of the nonvolatile memory device 100 shown in FIG. 1A, according to an embodiment of the disclosure. Referring to FIG. 1C, a silicide layer 176 may be arranged over the portion 116a of the first floating gate 182a. A spacer structure 162 may be arranged over a sidewall of the first floating gate 182a. A silicide layer 168 may be arranged over a first doped region 152 in the first active region 108a and a silicide layer 170 may be arranged over a second doped region 156 in the first active region 108a. A gate dielectric layer 180 may be arranged between the first floating gate 182a and the first active region 108a. Although not shown, a contact 158 and 160 may be formed over the silicide layers 168 and 170, respectively, for connection to an external input terminal.

FIG. 1D is a cross-section view of a contact 150 of an n-well capacitor taken along section line C-C' of the nonvolatile memory device 100 shown in FIG. 1A, according to an embodiment of the disclosure. Referring to FIG. 1D, a silicide exclusion layer 186 may be arranged over a center portion 128 of the n-well region 110. An interlayer dielectric (ILD) layer 196 may be arranged over the silicide exclusion layer 186 and a contact 150 may be arranged in the interlayer dielectric layer 196 and over the center portion 128 of the n-well region 110. A lower portion of the contact 150 may penetrate through the silicide exclusion layer 186 to contact the center portion 128 of the n-well region 110.

FIG. 2A through 4B illustrates various steps of a fabrication process for semiconductor device 100, in accordance with an embodiment of the disclosure. FIG. 2A is a cross-section view of a partially completed n-well capacitor taken along section line A-A' of the nonvolatile memory device 100 shown in FIG. 1A after formation of an isolation structure 106 and an n-well region 110, while FIG. 2B is a cross-section view of a partially completed memory transistor taken along section line B-B' of the nonvolatile memory device 100 shown in FIG. 1A after formation of a first active region 108a in the substrate 102, according to an embodiment of the disclosure.

A semiconductor substrate 102 is first provided. The substrate 102 may be made of a suitable semiconductor material, for example silicon, or any other suitable semiconductor. An isolation structure 106 may first be formed in the substrate 102, part of which is shown in FIG. 2A. The formation of the isolation structure 106 may include forming an opening in the substrate 102 by a standard photolithography process and a wet etch or dry etch process. The standard photolithography process may include depositing a layer of photoresist material over the top surface of the substrate 102 followed by exposure and developing to form a suitable photoresist pattern. A wet etch or dry etch process may be used to remove a portion of the substrate 102 not covered by the photoresist pattern to thereby form the opening in the substrate 102. A layer of suitable dielectric material, for example silicon dioxide ($SiO_2$) may be deposited in the opening. A suitable planarization process, for example chemical mechanical planarization (CMP) may be used to remove a portion of the silicon dioxide layer from a top surface of the substrate 102 leaving behind another portion of the silicon dioxide layer in the opening thereby forming the isolation structure 106. An n-well region 110 may be formed in the substrate 102 adjacent to the isolation structure 106. The formation of the n-well region 110 may include doping the substrate 102 with a suitable dopant, for example phosphorus (P) or arsenic (As), or any other suitable n-type dopant to thereby form the n-well region 110.

Figure 2B:
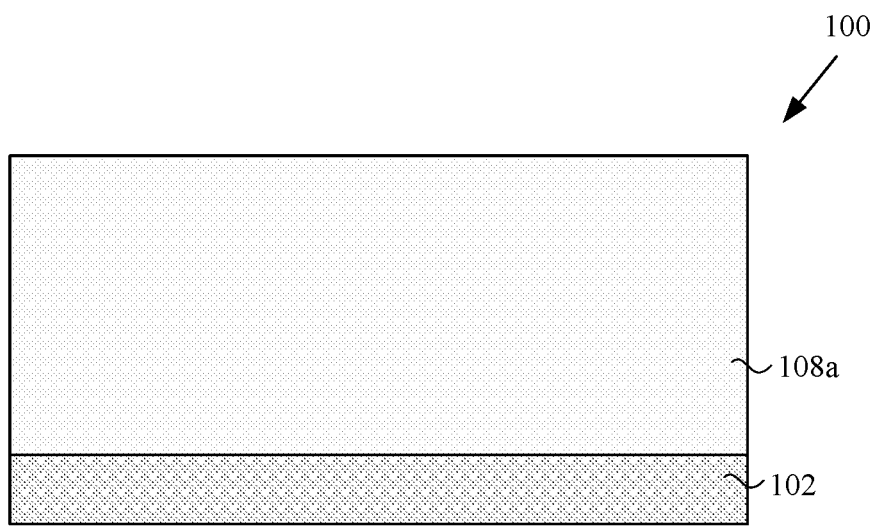

Referring now to FIG. 2B, a first active region 108a is formed in the substrate 102, surrounded by the isolation structure 106 as shown in FIG. 1A. Formation of the active region 108a may include doping a portion of the substrate 102 with a suitable dopant, for example boron (B) or any other suitable p-type dopant to thereby form the first active region 108a. The second active region 108b may also be formed at this time.

Figure 3A:
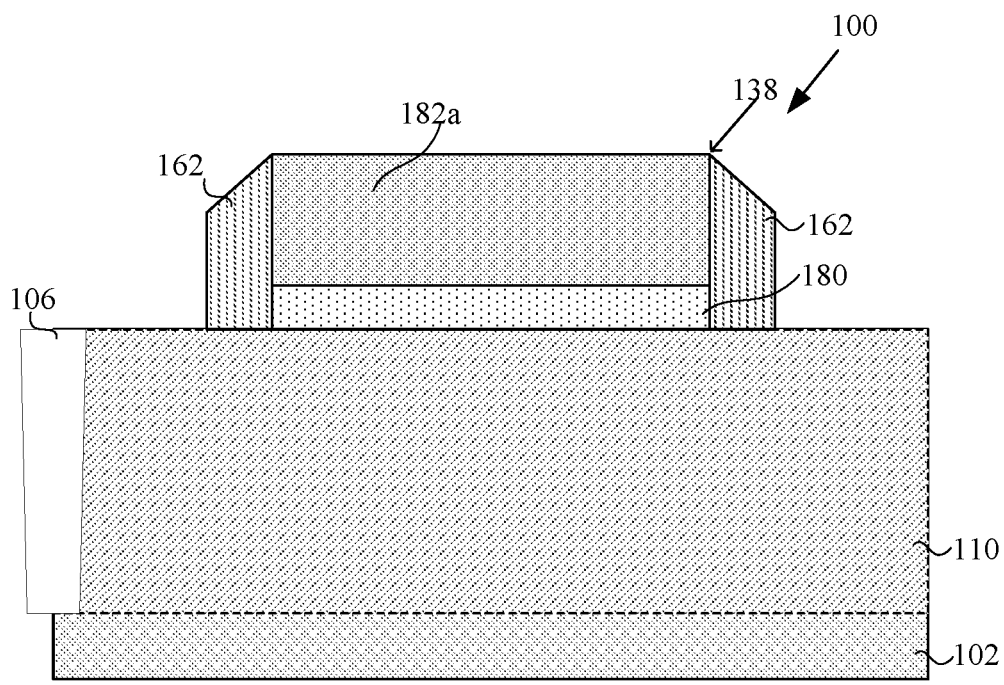
Figure 3B:
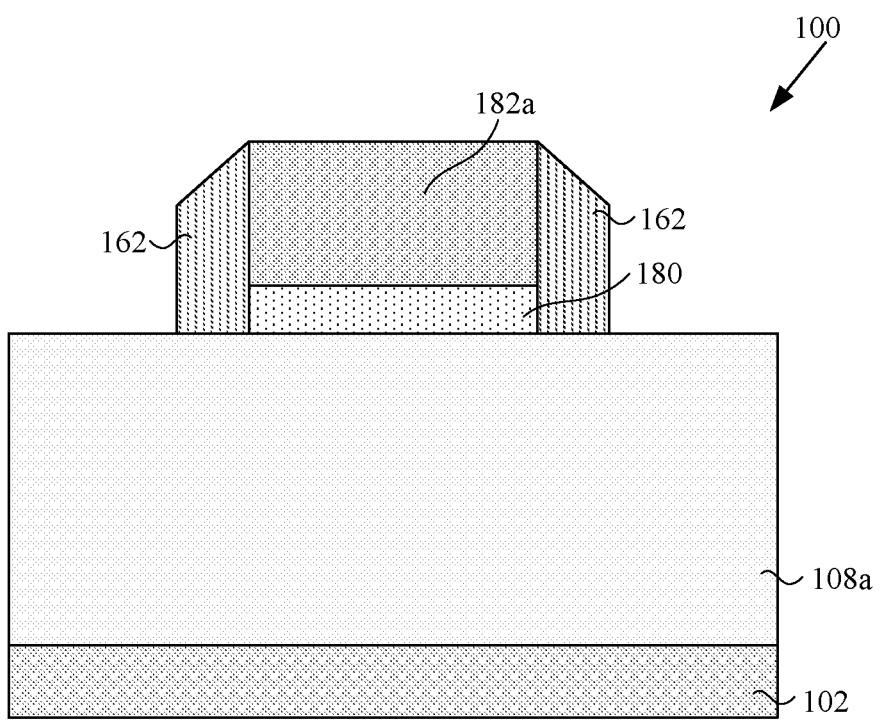

FIG. 3A is a cross-section view of a partially completed n-well capacitor taken along section line A-A' of the nonvolatile memory device 100 shown in FIG. 1A, while FIG. 3B is a cross-section view of a partially completed memory transistor taken along section line B-B' of the nonvolatile memory device 100 shown in FIG. 1A at a subsequent stage of the fabrication process.

Referring to FIG. 3A, a layer of suitable dielectric material, for example silicon dioxide ($SiO_2$) or any other suitable dielectric material, may be formed over the top surface of the n-well region 110 by thermal oxidation, atomic layer deposition (ALD), chemical vapor deposition (CVD), physical vapor deposition (PVD) or any other suitable oxidation or deposition processes. A layer of n+ doped polysilicon may be deposited over the silicon dioxide layer by atomic layer deposition (ALD), chemical vapor deposition (CVD), physical vapor deposition (PVD) or any other suitable deposition processes. The doped polysilicon and the silicon dioxide layer may be patterned by a conventional photolithography and a wet etch or dry etch process to thereby form the first floating gate 182a and the gate dielectric 180, respectively. A spacer structure 162 may be formed over a sidewall of the first floating gate 182a and over a side surface of the gate dielectric 180 by depositing a suitable dielectric material, for example silicon dioxide ($SiO_2$), silicon nitride ($Si_3N_4$), silicon oxynitride (SiON), or any other suitable dielectric material followed by anisotropic etching to thereby form the spacer structure 162. The term "anisotropic etching" may refer to an etching process that is directional in nature.

Referring to FIG. 3B, the formation of the gate dielectric layer 180, the first floating gate 182a, and the spacer structure 162 of the memory transistor may be done simultaneously with the formation of the gate dielectric layer 180, the first floating gate 182a and the spacer structure 162, respectively, of the n-well capacitor shown in FIG. 3A. The gate dielectric layer 180 may be formed above a top surface of the first active region 108a and below the first floating gate 182a. The spacer structure 162 may be formed over a sidewall of the first floating gate 182a. Although not shown, an extension doped region may be formed in an upper surface of the first active region 108a and laterally displaced from the first floating gate 182a on a first side and on a second side opposite to the first side. The extension doped region may extend laterally slightly below the first floating gate 182a.

Figure 4A:
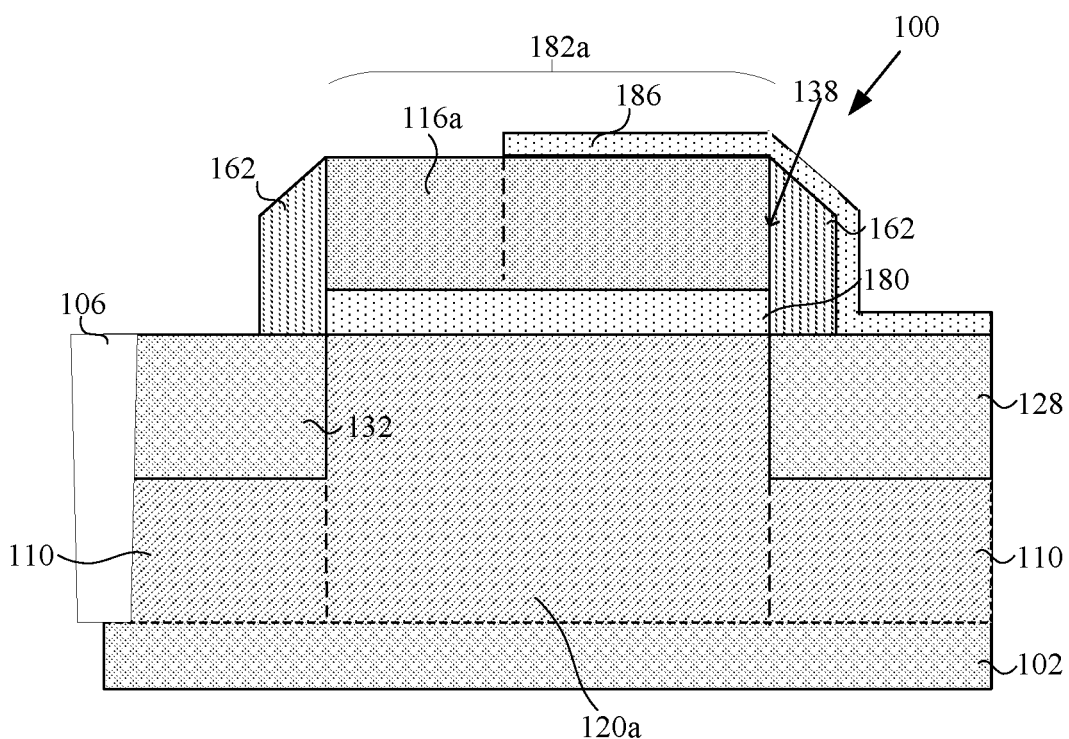
Figure 4B:
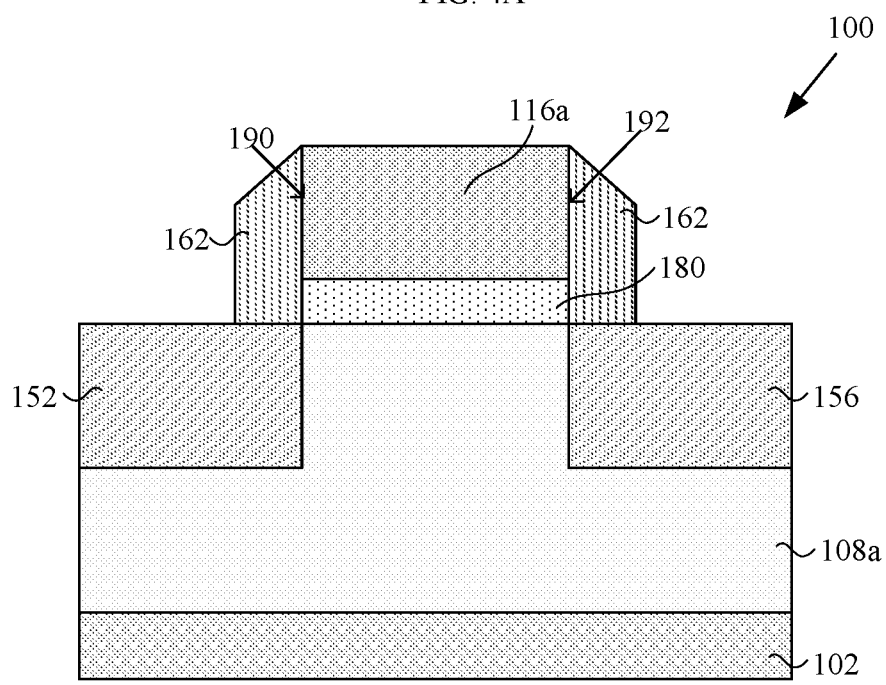

FIG. 4A is a cross-section view of a partially completed n-well capacitor taken along section line A-A' of the nonvolatile memory device 100 shown in FIG. 1A while FIG. 4B is cross-section view of a partially completed memory transistor taken along section line B-B' of the nonvolatile memory device 100 shown in FIG. 1A at a subsequent stage of the fabrication process.

Referring to FIG. 4A, the formation of the center portion 128 of the n-well region 110 and the edge portion 132 of the n-well region 110 include doping the n-well region 110 with a suitable n-type dopant, for example phosphorus (P) or arsenic (As), or any other suitable n-type dopant to form n+ doped regions adjacent to the first floating gate 182a and thereby forming the center portion 128 of the n-well region 110 and the edge portion 132 of the n-well region 110. The formation of the silicide exclusion layer 186 may include depositing a layer of suitable dielectric material, for example silicon dioxide (SiO$_2$) over a top surface of the first floating gate 182a, over a spacer structure 162 adjacent to a sidewall of the first floating gate 182a and over a top surface of the center portion 128 of the n-well region 110 by a suitable deposition process, for example atomic layer deposition (ALD), chemical vapor deposition (CVD), physical vapor deposition (PVD), or any other suitable deposition processes. A conventional photolithography process and a wet or dry etch process may be used to pattern the silicon dioxide layer to leave behind a portion of the silicon dioxide layer over at least part of the top surface of the first floating gate 182a, over a spacer structure 162 adjacent to the sidewall of the first floating gate 182a and over the top surface of the center portion 128 of the n-well region 110 to thereby form the silicide exclusion layer 186. A portion 116a of the first floating gate 182a adjacent to the silicide exclusion layer 186 and the edge portion 132 of the n-well region 110 may be exposed after the patterning of the silicon dioxide layer.

Referring to FIG. 4B, the formation of the first doped region 152 and the second doped region 156 of the memory transistor may be done simultaneously with the formation of the center portion 128 of the n-well region 110 and the edge portion 132 of the n-well region 110 of the n-well capacitor shown in FIG. 4A.

Referring back to FIG. 1B, a silicide layer 176 may be formed over the portion 116a of the first floating gate 182a and a silicide layer 178 may be formed over the edge portion 132 of the n-well region 110. The formation of the silicide layers 176 and 178 may include depositing a layer of suitable metal, for example cobalt, titanium, nickel (Ni), or any other suitable metal over a top surface of the portion 116a of the first floating gate 182a and over a top surface of the edge portion 132 of the n-well region 110. A suitable heating process, for example furnace annealing, rapid thermal annealing, laser heating, or any other suitable heating process may be used to form a silicide layer over the portion 116a of the first floating gate 182a and over the edge portion 132 of the n-well region 110. The unreacted cobalt layer may be removed to leave behind the silicide layer over the portion 116a of the first floating gate 182a and over the edge portion 132 of the n-well region 110 thereby forming the silicide layers 176 and 178, respectively.

FIG. 1C shows a cross-section view of a memory transistor taken along section line B-B' of the nonvolatile memory device 100 shown in FIG. 1A after formation of silicide layers 176, 168 and 170, according to an embodiment of the disclosure. Referring back to FIG. 1C, the formation of the silicide layers 176, 168 and 170 over the a portion 116a of the first floating gate 182a, over the first doped region 152 and over the second doped region 156, respectively, of the memory transistor may be done simultaneously with the formation of the silicide layers 176 and 178 of the n-well capacitor shown in FIG. 1B.

Referring back to FIG. 1A, although not shown for simplicity, an interlayer dielectric (ILD) layer 196 may be formed over a top surface of each active region 108a and 108b, the n-well region 110, each floating gate 182a, 182b, 182c and 182d and over the isolation structure 106. The formation of the interlayer dielectric (ILD) layer 196 is well known in the art and will not be further elaborated upon. An opening may be formed in the interlayer dielectric (ILD) layer 196 over the center portion 128 of the n-well region 110, over the first doped region 152 and over the second doped region 156 in each active region 108a and 108b by a conventional photolithography process and a wet etch or dry etch. A suitable conductive material, for example tungsten (W), copper (Cu), may be deposited in the opening and planarized by a suitable planarization process, for example chemical mechanical planarization (CMP) to leave behind a layer of tungsten in the opening thereby forming the contacts 150, 158 and 160, respectively.

Figure 5A:
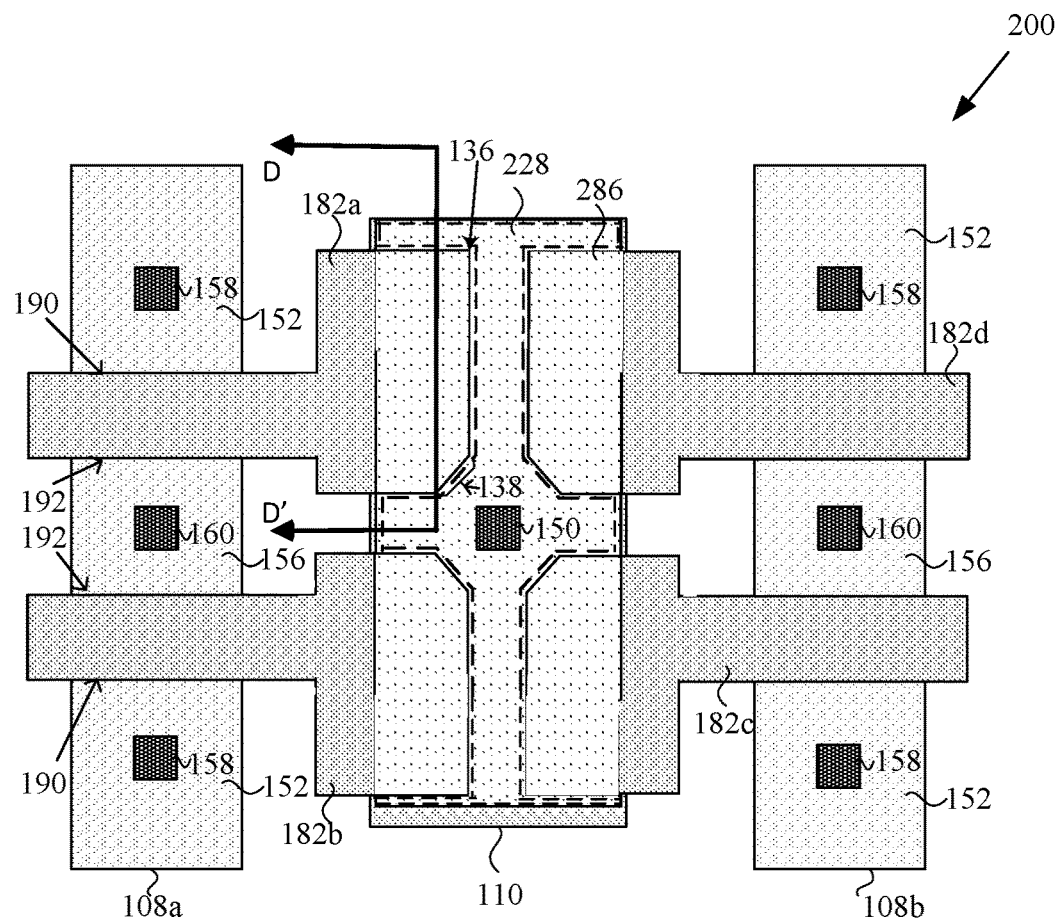
FIG. 5A is a top view of a nonvolatile memory device, according to another embodiment of the disclosure.

FIG. 5A shows a top view of a nonvolatile memory device 200, according to another embodiment of the disclosure. Like reference numerals in FIGS. 1A to 1D to refer to like features in FIGS. 5A and 5B. In contrast to the nonvolatile memory device 100 shown in FIG. 1A, the nonvolatile memory device 200 shows a silicide exclusion layer 286 completely covering a portion of each floating gate 182a, 182b, 182c and 182d over a side portion of the n-well region 110. The silicide exclusion layer 286 may cover a first corner 138 and a second corner 136 opposite to the first corner 138 of each floating gate 182a, 182b, 182c and 182d, whereby the first corner 138 and the second corner 136 of each floating gate 182a, 182b, 182c and 182d are over the side portion of the n-well region 110. The silicide exclusion layer may also extend over a center portion 228 of the n-well region 110 adjacent to the side portion of the n-well region 110 under each floating gate 182a, 182b, 182c and 182d. The center portion 228 of the n-well region 110 is shown as a dashed outline. The first 108a and the second 108b active regions, the floating gates 182a, 182b, 182c and 182d, the first 152 and second 156 doped regions, the contacts 150, 158 and 160, and the isolation structure is the same as shown in FIG. 1A.

In one embodiment, the silicide exclusion layer 286 may surround the contact 150. In another embodiment, the silicide exclusion layer 286 may extend below the contact 150.

The nonvolatile memory device 200 may offer improved data retention as the silicide exclusion layer 286 covers a larger proportion of each floating gate 182a, 182b, 182c and 182d and a larger proportion of the n-well region 110.

Figure 5B:
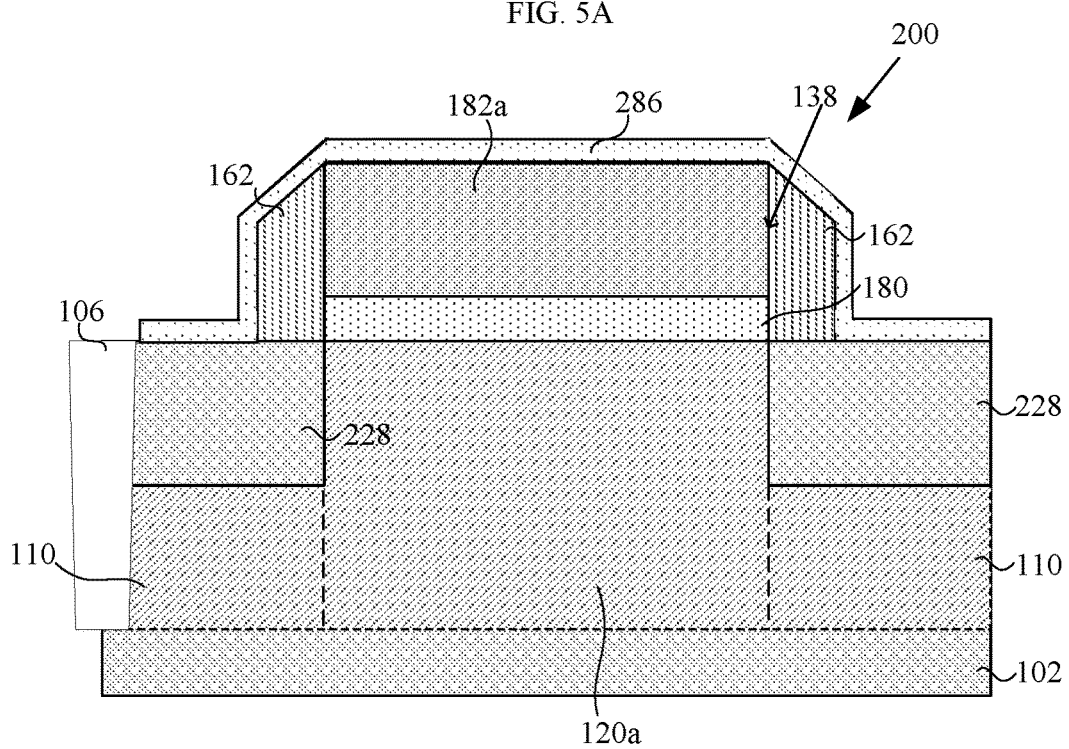
FIG. 5B is a cross-section view of an n-well capacitor taken along section line D-D' of the nonvolatile memory device shown in FIG. 5A, according to another embodiment of the disclosure.

FIG. 5B is a cross-section view of an n-well capacitor taken along section line D-D' of the nonvolatile memory device 200 shown in FIG. 5A, according to an embodiment of the disclosure. Referring to FIG. 5B, a silicide exclusion layer 286 may be arranged over a portion of the first floating gate 182a over the side portion 120a of the n-well region 110, over a spacer structure 162 adjacent to a sidewall of the first floating gate 182a and over the center portion 228 of the n-well region 110.

The formation of the first active region 108a, the second active region 108b, the n-well region 110, the floating gates 182a, 182b, 182c and 182d, the spacer structure 162, the first doped region 152 and the second doped region 156 is similar to the process flow to fabricate the nonvolatile memory device 100 shown in FIGS. 2A and 3A and FIGS. 2B, 3B to 4B and 1C. Referring to FIG. 5B, the formation of the center portion 228 of the n-well region 110 is similar to the formation of the center portion 128 of the n-well region illustrated in FIG. 4A. The formation of the silicide exclusion layer 286 may include depositing a layer of suitable dielectric material, for example silicon dioxide (SiO$_2$) over the first floating gate 182a, over the spacer structure 162 and over the center portion 228 of the n-well region 110. A conventional photolithography and a wet etch or dry etch process may be used to pattern the silicon dioxide layer to leave behind a portion of the silicon dioxide layer at least partially over the first floating gate 182a, over the spacer structure 162 and over the center portion 228 of the n-well region 110 to thereby form the silicide exclusion layer 286.

FIG. 6A is a top view of a nonvolatile memory device 300, according to another embodiment of the disclosure. In contrast to the nonvolatile memory devices 100 and 200 shown in FIGS. 1A and 5A, respectively, the nonvolatile memory device 300 shows a silicide exclusion layer 376 at least partially over the first floating gate 182a and the second floating gate 182b over a portion of the first active region 108a. The silicide exclusion layer 376 may also be at least partially over the third floating gate 182c and the fourth floating gate 182d over a portion of the second active region 108b and over a first doped region 152 of each active region 108a and 108b. The first 108a and the second 108b active regions, the floating gates 182a, 182b, 182c and 182d, the first 152 and second 156 doped regions, the contacts 150, 158 and 160, and the isolation structure is the same as shown in FIG. 1A.

The silicide exclusion layer 376 may be provided at least partially over each floating gate 182a, 182b, 182c and 182d. The silicide exclusion layer 376 may completely cover a portion of each floating gate 182a, 182b, 182c and 182d over the side portion of the n-well region 110. The silicide exclusion layer 376 may extend over a center portion 328 of the n-well region 110 adjacent to the side portion of the n-well region under each floating gate 182a, 182b, 182c and 182d. The center portion 328 of the n-well region 110 is shown as a dashed outline. Although not shown, the silicide exclusion layer 376 may extend over the isolation region between each active region 108a and 108b and the n-well region 110.

FIG. 6B is a cross-section view of a memory transistor taken along section line E-E' of the nonvolatile memory device 300 shown in FIG. 6A, according to another embodiment of the disclosure. Referring to FIG. 6B, a silicide exclusion layer 376 may be arranged at least partially over the first floating gate 182a, over a spacer structure 162 adjacent to a sidewall of the first floating gate 182a and over the first doped region 152 of the first active region 108a. A silicide layer 366 may be arranged over a portion 396a of the first floating gate 182a adjacent to the silicide exclusion layer 376. The silicide layer 170 is similar to the silicide layer 170 shown in FIG. 1C.

The fabrication of each active region 108a and 108b, the n-well region 110, each floating gate 182a, 182b, 182c and 182d, the spacer structure 162, the first doped region 152 and the second doped region 156 is similar to the fabrication process flow illustrated in FIGS. 2A to 3A and FIGS. 2B, 3B to 4B. Referring to FIG. 6A, the formation of the center portion 328 of the n-well region 110 is similar to the formation of the center portion 228 of the n-well region 110 illustrated in FIG. 5B. Referring to FIGS. 6A and 6B, the formation of a silicide exclusion layer 376 at least partially over each floating gate 182a, 182b, 182c and 182d, over the center portion 328 of the n-well region 110 and over the first doped region 152 of each active region 108a and 108b may be done simultaneously. A layer of a suitable dielectric, for example silicon dioxide may be deposited over each floating gate 182a, 182b, 182c and 182d, over the n-well region 110 and over the first doped region 152 of each active region 108a and 108b. The silicon dioxide layer may be patterned by a conventional photolithography process and a wet etch or dry etch to leave behind a portion of the silicon dioxide layer at least partially over each floating gate 182a, 182b, 182c and 182d, over the center portion 328 of the n-well region 110 and over the first doped region 152 of each active region 108a and 108b thereby forming the silicide exclusion layer 376.

FIG. 7A is a top view of a nonvolatile memory device 400, according to another embodiment of the disclosure. In contrast to the nonvolatile memory device 100 shown in FIG. 1A, the nonvolatile memory device 400 includes a silicide exclusion layer 498 arranged at least partially over a first floating gate 182a and over a second floating gate 182b over a portion of a first active region 108a. The silicide exclusion layer 498 may also be arranged at least partially over a third floating gate 182c and over a fourth floating gate 182d over a portion of a second active region 108b. The silicide exclusion layer 498 may also be arranged over a second doped region 156 of each active region 108a and 108b. The first 108a and the second 108b active regions, the floating gates 182a, 182b, 182c and 182d, the first 152 and second 156 doped regions, the contacts 150, 158 and 160, and the isolation structure is the same as shown in FIG. 1A.

Referring to FIG. 7A, the silicide exclusion layer 498 may be formed at least partially over each floating gate 182a, 182b, 182c and 182d over a side portion of the n-well region 110. The silicide exclusion layer 498 may cover a first corner 138 of each floating gate 182a, 182b, 182c and 182d over the side portion of the n-well region 110, whereby the first corner 138 may be proximal to the contact 150 over the n-well region 110. The silicide exclusion layer 498 may extend over a center portion 428 of the n-well region 110 adjacent to the side portion of the n-well region 110 under each floating gate 182a, 182b, 182c and 182d. The center portion 428 of the n-well region 110 is illustrated as a dashed outline. Although not shown, the silicide exclusion layer 498 may extend over an isolation region between each active region 108a and 108b and the n-well region 110.

FIG. 7B is a cross-section view of a memory transistor taken along section line G-G' of the nonvolatile memory device 400 shown in FIG. 7A, according to another embodiment of the disclosure. Referring to FIG. 7B, a spacer structure 162 may be provided over a sidewall of the first floating gate 182a. A silicide exclusion layer 498 may be provided at least partially over the first floating gate 182a, over the spacer structure 162 arranged over a sidewall of the first floating gate 182a and over the second doped region 156 of the first active region 108a. A silicide layer 476 may be provided over a portion 416a of the first floating gate 182a adjacent to the silicide exclusion layer 498. The silicide layer 168 is similar to the silicide layer 168 shown in FIG. 1C.

The fabrication of each active region 108a and 108b, the n-well region 110, each floating gate 182a, 182b, 182c and 182d, the spacer structure 162, the first doped region 152 and the second doped region 156 is similar to the fabrication process flow illustrated in FIGS. 2A to 3A and FIGS. 2B, 3B to 4B. Referring to FIG. 7A, the formation of the center portion 428 of the n-well region 110 and the edge portion 432 of the n-well region 110 is similar to the formation of the center portion 128 and the edge portion 132, respectively, of the n-well region 110 shown in FIG. 4A. The formation of the silicide exclusion layer 498 may include depositing a layer of suitable dielectric material, for example silicon dioxide (SiO$_2$) over each floating gate 182a, 182b, 182c and 182d, over the center portion 428 of the n-well region 110 and over the second doped region 156 of each active region 108a and 108b. The silicon dioxide layer may be patterned by a conventional photolithography process and a wet etch or dry etch to leave behind a portion of the silicon dioxide layer at least partially over each floating gate 182a, 182b, 182c and 182d, over the center portion 428 of the n-well region 110 and over the second doped region 156 of each active region 108a and 108b to thereby form the silicide exclusion layer 498.

FIG. 8A is a top view of a nonvolatile memory device 500, according to another embodiment of the disclosure. In contrast to the nonvolatile memory device 300 shown in FIG. 6A, the nonvolatile memory device 500 includes a silicide exclusion layer 592 arranged over each floating gate 182a, 182b, 182c and 182d. The first 108a and the second 108b active regions, the floating gates 182a, 182b, 182c and 182d, the first 152 and second 156 doped regions, the contacts 150, 158 and 160, and the isolation structure is the same as shown in FIG. 1A.

Referring to FIG. 8A, the silicide exclusion layer 592 may be provided over each floating gate 182a, 182b, 182c and 182d, whereby the silicide exclusion layer 592 may completely cover each floating gate 182a, 182b, 182c and 182d, including the first corner 138 over the side portion of the n-well region 110. The silicide exclusion layer 592 may extend over a center portion 528 of the n-well region 110 adjacent to the side portion of the n-well region 110 under each floating gate 182a, 182b, 182c and 182d. The center portion 528 of the n-well region 110 is illustrated as a dashed outline.

FIG. 8B is a cross-section view of a memory transistor taken along section line H-H' of the nonvolatile memory device 500 shown in FIG. 8A, according to another embodiment of the disclosure. Referring to FIG. 8B, a spacer structure 162 may be provided over a sidewall of the first floating gate 182a. A silicide exclusion layer 592 may be provided over a top surface of the first floating gate 182a. The gate dielectric layer 180 and the silicide layers 168 and 170 are similar to the gate dielectric layer 180 and the silicide layers 168 and 170 shown in FIG. 1C.

The fabrication of each active region 108a and 108b, the n-well region 110, each floating gate 182a, 182b, 182c and 182d, the spacer structure 162, the first doped region 152 and the second doped region 156 are similar to the fabrication process flow illustrated in FIGS. 2A to 3A and FIGS. 2B, 3B to 4B. The fabrication process of the center portion 528 of the n-well region 110 is similar to the fabrication process of the center portion 228 of the n-well region 110 illustrated in FIG. 5B.

Referring to FIG. 8A, the formation of the silicide exclusion layer 592 may include depositing a layer of suitable dielectric material, for example silicon dioxide (SiO$_2$) over each floating gate 182a, 182b, 182c and 182d and over the center portion 528 of the n-well region 110. The silicon dioxide layer may be patterned by a conventional photolithography process followed by a wet etch or dry etch to leave behind a portion of the silicon dioxide layer over each floating gate 182a, 182b, 182c and 182d and over the center portion 528 of the n-well region 110 thereby forming the silicide exclusion layer 592.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:
1. A nonvolatile memory device comprising:
   an active region, an n-well region and an isolation region separating the active region and the n-well region;
   a floating gate over a portion of the active region and a first portion of the n-well region;

a first doped region in the active region laterally displaced from the floating gate on a first side;

a second doped region in the active region laterally displaced from the floating gate on a second side opposite to the first side;

a contact over the n-well region, wherein the contact is laterally displaced from a first corner of the floating gate over the first portion of the n-well region; and a silicide exclusion layer at least partially over the floating gate.

2. The nonvolatile memory device of claim 1, wherein the silicide exclusion layer covers the first corner of the floating gate over the first portion of the n-well region, wherein the first corner is proximal to the contact over the n-well region.

3. The nonvolatile memory device of claim 2, wherein the silicide exclusion layer extends over a second portion of the n-well region adjacent to the first portion of the n-well region under the floating gate and surrounds the contact.

4. The nonvolatile memory device of claim 3 further comprising:

a silicide layer over a portion of the floating gate next to the silicide exclusion layer.

5. The nonvolatile memory device of claim 4 further comprising:

a silicide layer over a third portion of the n-well region adjacent to the second portion of the n-well region.

6. The nonvolatile memory device of claim 5 further comprising:

a silicide layer over the first doped region and over the second doped region in the active region.

7. The nonvolatile memory device of claim 2, wherein the silicide exclusion layer completely covers a portion of the floating gate over the first portion of the n-well region.

8. The nonvolatile memory device of claim 2, wherein the silicide exclusion layer extends over a portion of the floating gate over the active region.

9. The nonvolatile memory device of claim 8, wherein the silicide exclusion layer extends over the first doped region in the active region.

10. The nonvolatile memory device of claim 8 further comprising:

a silicide layer partially over the floating gate over the active region.

11. The nonvolatile memory device of claim 7, wherein the silicide exclusion layer completely covers the portion of the floating gate over the active region.

12. The nonvolatile memory device of claim 11 further comprising:

a silicide layer over the first doped region and over the second doped region in the active region.

13. The nonvolatile memory device of claim 10, wherein the silicide exclusion layer extends over the second doped region in the active region.

14. The nonvolatile memory device of claim 13 further comprising:

a silicide layer over the first doped region in the active region.

15. A nonvolatile memory device comprising:

a first active region, a second active region, an n-well region between the first active region and the second active region and an isolation region separating the first active region, the second active region and the n-well region;

a first floating gate and a second floating gate over a portion of the first active region and a third floating gate and a fourth floating gate over a portion of the second active region, wherein each floating gate is over a side portion of the n-well region;

a first doped region in each active region laterally displaced from each floating gate on a first side;

a second doped region in each active region laterally displaced from each floating gate on a second side opposite to the first side;

a contact over the n-well region, wherein the contact is laterally displaced from a first corner of each floating gate over the side portion of the n-well region; and a silicide exclusion layer at least partially over each floating gate, wherein the silicide exclusion layer covers the first corner of each floating gate over the side portion of the n-well region, wherein the first corner is proximal to the contact over the n-well region.

16. The nonvolatile memory device of claim 15, wherein the silicide exclusion layer extends over a center portion of the n-well region adjacent to the side portion of the n-well region under each floating gate and surrounds the contact.

17. The nonvolatile memory device of claim 16, further comprising:

a silicide layer over a portion of each floating gate next to the silicide exclusion layer.

18. A method of fabricating a nonvolatile memory device comprising:

providing an active region, an n-well region and an isolation region separating the active region and the n-well region;

providing a floating gate over a portion of the active region and over a first portion of the n-well region;

providing a first doped region in the active region laterally displaced from the floating gate on a first side;

providing a second doped region in the active region laterally displaced from the floating gate on a second side opposite to the first side;

providing a silicide exclusion layer at least partially over the floating gate; and providing a contact over the n-well region, wherein the contact is laterally displaced from a first corner of the floating gate over the first portion of the n-well region.

19. The method of claim 18, wherein providing a silicide exclusion layer at least partially over the floating gate further comprises:

forming a silicide exclusion layer at least partially over the floating gate; and forming a silicide layer over a portion of the floating gate adjacent to the silicide exclusion layer.

20. The method of claim 19, wherein providing a contact over the n-well region, wherein the contact is laterally displaced from a first corner of the floating gate over the first portion of the n-well region further comprises:

forming a silicide exclusion layer over a second portion of the n-well region adjacent to the first portion of the n-well region under the floating gate;

forming a silicide layer over a third portion of the n-well region adjacent to the second portion of the n-well region; and forming a contact over the n-well region and through the silicide exclusion layer, wherein the contact is laterally displaced from the first corner of the floating gate over the first portion of the n-well region.

* * * * *